United States Patent
Kim et al.

(10) Patent No.: US 8,604,625 B1
(45) Date of Patent: Dec. 10, 2013

(54) SEMICONDUCTOR DEVICE HAVING CONDUCTIVE PADS TO PREVENT SOLDER REFLOW

(75) Inventors: Byong Jin Kim, Kyunggi-Do (KR); Min Chul Shin, Gwangju Si (KR); Ho Choi, Gwangju Si (KR)

(73) Assignee: Amkor Technology, Inc., Chandler, AZ (US)

( * ) Notice: Subject to any disclaimer, the term of this patent is extended or adjusted under 35 U.S.C. 154(b) by 814 days.

(21) Appl. No.: 12/708,432

(22) Filed: Feb. 18, 2010

(51) Int. Cl.
*H01L 23/48* (2006.01)
*H01L 23/52* (2006.01)
*H01L 29/40* (2006.01)
*H01L 21/44* (2006.01)
*B23K 31/00* (2006.01)
*B23K 31/02* (2006.01)

(52) U.S. Cl.
USPC ........... 257/779; 257/737; 257/750; 257/780; 257/786; 257/E23.023; 438/614; 438/652; 228/180.22

(58) Field of Classification Search
None
See application file for complete search history.

(56) References Cited

U.S. PATENT DOCUMENTS

| 7,015,590 B2 * | 3/2006 | Jeong et al. ............... 257/780 |
| 7,098,126 B2 * | 8/2006 | Hsieh et al. ............... 438/614 |
| 2004/0089946 A1 * | 5/2004 | Wen ............................ 257/737 |

OTHER PUBLICATIONS

Definition of thereon. (n.d.) The American Heritage® Dictionary of the English Language, Fourth Edition. (2003). Retrieved Apr. 18, 2013 from http://www.thefreedictionary.com/thereon.*

* cited by examiner

*Primary Examiner* — Michael Jung
(74) *Attorney, Agent, or Firm* — McAndrews, Held & Malloy

(57) ABSTRACT

A semiconductor device has a substrate having a plurality of conductive pads formed thereon. A semiconductor die is provided having a plurality of conductive pillars formed thereon. A solder is used for electrically coupling the conductive pillars to the conductive pads. Solder mask is formed on portions of the conductive pads to prevent the solder from flowing in an unwanted direction on the conductive pads.

20 Claims, 5 Drawing Sheets

SEMICONDUCTOR DEVICE HAVING CONDUCTIVE PADS TO PREVENT SOLDER REFLOW

FIELD OF THE INVENTION

This invention relates to a semiconductor device and, more specifically, to a semiconductor device having conductive pads which prevent solder reflow during coupling of the semiconductor device to a substrate.

BACKGROUND OF THE INVENTION

In general, an electrically conductive pad is formed on a substrate to couple an electrically conductive pillar on a semiconductor die to the electrically conductive pad. In order to facilitate the coupling between the electrically conductive pad and the electrically conductive pillar, a solder is plated or coated onto the electrically conductive pad prior to the coupling.

In order to couple a semiconductor die to a substrate, the semiconductor die is first aligned with the substrate. Heat is applied to the substrate at high temperature to cause a solder to reflow. The substrate is subsequently cooled electrically and mechanically coupling the electrically conductive pillar on the semiconductor die to the electrically conductive pad on the substrate via the solder.

A passivation layer is coated on the substrate excluding the electrically conductive pad. Thus, the electrically conductive pads are exposed directly to the outside. Further, the electrically conductive pad is formed in a line shape having a predetermined length. Thus, during a reflow process for interconnecting the semiconductor die to the substrate, the solder previously formed by plating on the electrically conductive pad (hereinafter, to be called a "plating solder") has an irregular shape. That is, the molten plating solder may exist only on a portion of the line-shaped electrically conductive pad, which is generally referred to as "solder flying." In this case, a non-wetting phenomenon may occur in which the solder may not be formed on a portion of the electrically conductive pad that is substantially coupled to the electrically conductive pillar on the semiconductor die.

Accordingly, a conventional semiconductor device having the above-mentioned configuration may often suffer from failure of electrical and mechanical connection between the electrically conductive pillar and the electrically conductive pad, or faulty solder connection.

Therefore, a need existed to provide a system and method to overcome the above problem.

SUMMARY OF THE INVENTION

A semiconductor device has a substrate having a plurality of conductive pads formed thereon. A semiconductor die is provided having a plurality of conductive pillars formed thereon. A solder is used for electrically coupling the conductive pillars to the conductive pads. Solder mask is formed on portions of the conductive pads to prevent the solder from flowing in an unwanted direction on the conductive pads.

A fabricating method of a semiconductor device comprising: providing a substrate having a plurality of conductive pads; forming solder mask portions on the conductive pads; aligning a plurality of conductive pillars of a semiconductor die to the substrate; and attaching the plurality of conductive pillars to the plurality of conductive pads, wherein the solder mask portions prevent solder from flowing in an unwanted direction on the conductive pads.

The present invention is best understood by reference to the following detailed description when read in conjunction with the accompanying drawings.

BRIEF DESCRIPTION OF THE DRAWINGS

Common reference numerals are used throughout the drawings and detailed description to indicate like elements.

DETAILED DESCRIPTION

Figure 1A:
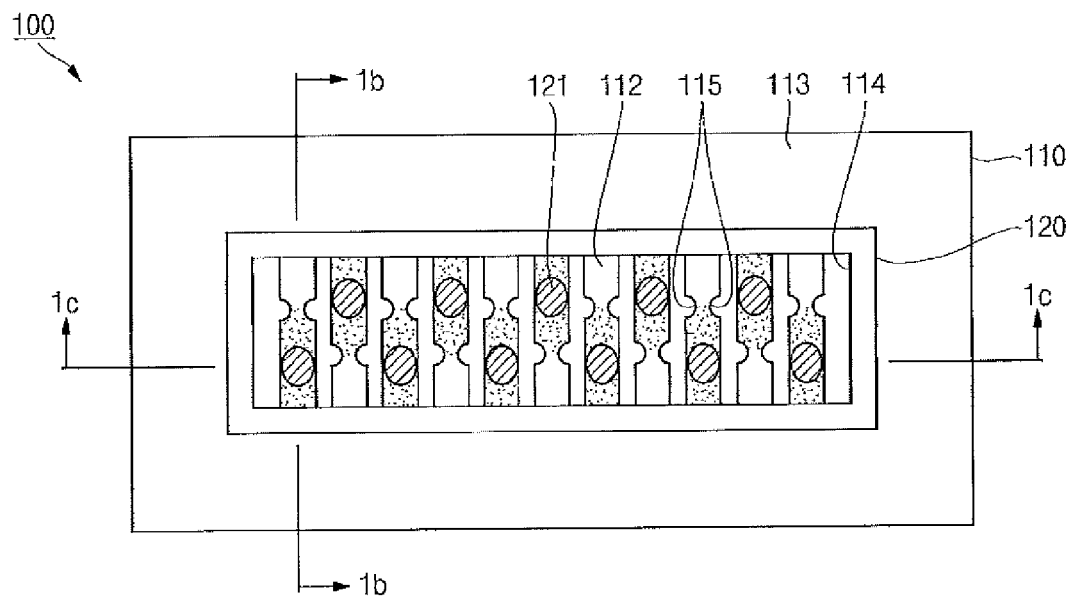
FIG. 1A is a top view of a semiconductor device according to an embodiment of the present invention.
Figure 1B:
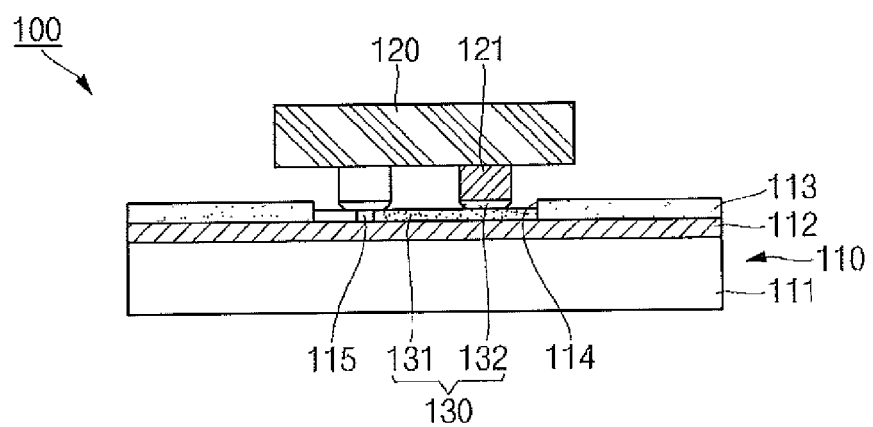
FIG. 1B is a cross-sectional views of the semiconductor device of FIG. 1A taken along lines 1b-1b.
Figure 1C:
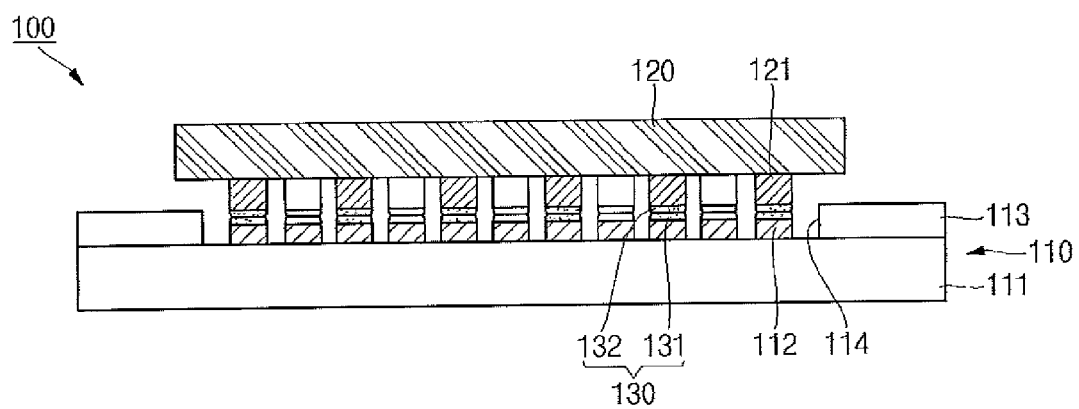
FIG. 1C is a cross-sectional views of the semiconductor device of FIG. 1A taken along lines 1c-1c.

As illustrated in FIGS. 1A through 1C, a semiconductor device 100 according to an embodiment of the present invention is shown. The semiconductor device 100 may include a substrate 110 having a plurality of electrically conductive pads 112, a semiconductor die 120 having a plurality of electrically conductive pillars 121, and a solder 130 electrically coupling the electrically conductive pillars 121 to the electrically conductive pads 112. The electrically conductive pad 112 may have a solder masking portion 115 formed therein. The solder masking portion may be used to prevent the solder 130 from flowing in an unwanted direction during coupling of the electrically conductive pillar 121 to the electrically conductive pad 112.

The substrate 110 may have an insulating layer 111. The plurality of line-shaped electrically conductive pads 112 may be arranged in a line on the insulating layer 111, and a passivation layer 113 may be used for covering the electrically conductive pads 112. The insulating layer 111 may be formed of a rigid or flexible material, and is not limited thereto. The passivation layer 113 may have a window of a predetermined size through which the electrically conductive pads 112 are all exposed to the outside. The window may have an approximately quadrilateral shape with area slightly less than that of the semiconductor die 120.

The electrically conductive pad 112 may be formed substantially of copper or the equivalent thereof and has a surface that may be plated with gold (Au), silver (Ag), nickel (Ni), or palladium (Pd) to enhance bonding with the solder 130. Further, as described above, the electrically conductive pad 112 may have solder masking portion 115 formed therein to prevent the solder 130 from flowing into an unwanted region during coupling of the electrically conductive pillar 121 to the electrically conductive pad 112.

The solder masking portion 115 may be separated from one side of the electrically conductive pillar 121 to reduce a width of the electrically conductive pad 112. For example, the solder masking portion 115 may be in the form of a groove. More specifically, the solder masking portion 115 may be grooves formed on both sides of the electrically conductive pad 112 symmetrically with respect to a longitudinal direction thereof. Alternatively, the solder masking portion 115 may be formed in the longitudinal direction on only one side of the electrically conductive pad 112. Although FIG. 1A shows the solder masking portion 115 has a semicircular shape, it may have other various shapes including, but not limited to, a triangular shape and a quadrilateral shape.

Meanwhile, a plating solder 131 may be formed on a surface of the electrically conductive pad 112. That is to say, the plating solder 131 may be formed by plating the solder 130 on the electrically conductive pad 112. Alternatively, the plating solder 131 may be generally formed only on a portion corresponding to the electrically conductive pillar 121. That is to say, with respect to the solder masking portion 115, the plating solder 131 is formed only on a portion of the electrically conductive pad 112 that is coupled to the electrically conductive pillar 121 while the plating solder 131 is not formed on a portion of the electrically conductive pad 112 that is not coupled to the electrically conductive pillar 121.

In this way, the plating solder 131 will not pass through the solder masking portion 115 into a portion in which the electrically conductive pillar 121 is not present during a reflow process in the fabrication of the semiconductor device 100 for coupling the electrically conductive pillar 121 to the electrically conductive pad 112. That is, during the interconnection between the electrically conductive pad 112 and the electrically conductive pillar 121, the plating solder 131 is formed only on the portion of the electrically conductive pad 112 that is coupled to the electrically conductive pillar 121.

The solder 130 that is reflown during the interconnection will not pass through the narrow solder masking portion 115 due to the relationship between a width of the electrically conductive pad 112 and a thickness of the solder 130.

It is generally known that a width of the electrically conductive pad 112 is proportional to a maximum allowable thickness of the solder 130. That is, if the electrically conductive pad 112 is narrow, the solder 130 can be formed thereon to a small thickness. Otherwise, if the electrically conductive pad 112 is wide, the solder 130 may have a large thickness. When the solder 130 is reflown on the electrically conductive pad 112 having a wide region and a narrow region that are connected to each other, the solder 130 is formed to have a large thickness on the wide region of the electrically conductive pad 112 while being to a small thickness on the narrow region thereof. Further, when a reflow process is performed after forming the solder 130 on the wide region of the electrically conductive pad 112, the solder 130 will remain only on the wide region and not flow into the narrow region.

For these reasons, during the reflow process or electrical connection, the plating solder 131 does not pass through the solder masking portion 115 and is present only on a portion of the electrically conductive pad 112 corresponding to the electrically conductive pillar 121.

The semiconductor die 120 is positioned above the substrate 110 and has a plurality of bond pads (not shown) or a redistribution layer (not shown) on a bottom surface thereof. The semiconductor die 120 may be one of a general silicon semiconductor, a compound semiconductor, and equivalents thereof.

The electrically conductive pillar 121 may be formed from a material including, but not limited to, copper and the equivalent thereof on the semiconductor die 120. The electrically conductive pillar 121 may be electrically coupled to a corresponding bonding pad or redistribution layer. The electrically conductive pillar 121 may also have a solder cap 132 at a lower end so as to facilitate adhesion with the plating solder 131. Herein, the solder 130 as used herein is defined to include the plating solder 131 and the solder cap 132.

The electrically conductive pillar 121 may also have an approximately elliptical cross-section with a major axis length and a minor axis length. Further, in this case, a direction of the major axis length of the electrically conductive pillar 121 is the same as a longitudinal direction of the electrically conductive pad 112. In this way, the electrically conductive pillar 121 is designed to have an elliptical cross-section, thereby achieving fine pitch while maintaining the strength of the electrically conductive pillar 121. That is, it is possible to attain the electrically conductive pillar 121 and the electrically conductive pad 112 with finer pitch.

In other words, in a case where the electrically conductive pillar 121 has a circular cross-section, reducing a diameter of the electrically conductive pillar 121 makes it possible to provide a semiconductor device 10 with finer pitch, which may, however, reduce the strength of the electrically conductive pillar 121, thereby resulting in degradation in reliability of the semiconductor device 100. To address this problem, according to the present invention, the electrically conductive pillar 121 may be designed to have an elliptical cross-section, thereby preventing the strength of the electrically conductive pillar 121 from lowering. In addition, a distance between neighboring electrically conductive pillars 121 and a distance between neighboring electrically conductive pads 112 can be further reduced by arranging the electrically conductive pillars 121 to have major axes of their cross-sections to be parallel with each other, thereby achieving the semiconductor device with finer pitch.

Figure 2:
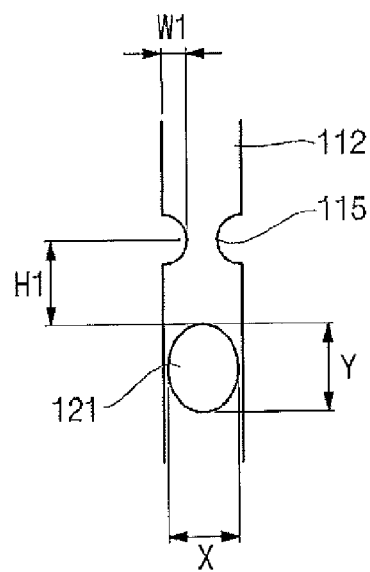
FIG. 2 is an enlarged view illustrating the relationship between dimensions of the electrically conductive pillar on the semiconductor die and the electrically conductive pad on the substrate in the semiconductor device shown in FIGS. 1A through 1C.

As illustrated in FIG. 2, the electrically conductive pillar 121 may have an elliptical cross-section with major and minor axis lengths. X and Y denote the minor and major axis lengths, respectively. W1 and H1 denote a depth to which the solder masking portion 115 is recessed into the electrically conductive pad 112 and a distance by which the solder masking portion 115 is separated from the electrically conductive pillar 121, respectively. In this case, the depth W1 also represents the width of the electrically conductive pad 112 shortened by the presence of the solder masking portion 115.

The electrically conductive pillar 121 may be designed to satisfy the following relationships with respect to the distance H1 and the depth W1:

$$Y*(1/2) \leq H1 \leq Y$$

$$X*(1/10) \leq W1 \leq X*(1/5)$$

where the distance H1 has a value ranging from half the major axis length, that is, $Y*(1/2)$, to the major axis length Y. If the distance H1 is less than half the major axis length, that is, $Y*(1/2)$, it is difficult to obtain a desired amount of the plating solder 131 on the electrically conductive pad 112. If the distance H1 exceeds the major axis length Y, the plating solder 131 will be distributed over an overly wide area of the electrically conductive pad 112, so that it is difficult to accurately position the electrically conductive pillars 121.

The depth W1 of the solder masking portion 115 formed in the electrically conductive pad 112 has a value ranging from one tenth, that is, $X*(1/10)$, to one fifth of the minor axis length, that is, $X*(1/5)$. If the depth W1 is less than one tenth of the minor axis length, that is, $X*(1/10)$, it is difficult to form the electrically conductive pad 112 and an electrical resistance may be increased. If the depth W1 exceeds one fifth of the minor axis length, that is, $X*(1/5)$, the solder 130 that is reflown on the electrically conductive pad 112 will pass through the solder masking portion 115.

Figure 3:
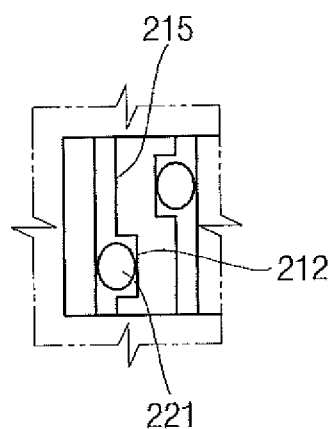
FIG. 3 is a top view of a portion of a semiconductor device according to another embodiment of the present invention.

Referring to FIG. 3, a top view of a portion of a semiconductor device according to another embodiment of the present invention is illustrated. Since the semiconductor device according to the current embodiment has substantially the same configuration as the semiconductor device 100 shown in FIGS. 1A through 1C, only the differences between the two embodiments is described.

An electrically conductive pad 212 has solder masking portions 215 separated from opposite sides of an electrically conductive pillar 221. That is, the solder masking portions 215 are disposed on the opposite sides of the electrically conductive pillar 221 in a major axis length direction. More specifically, the solder masking portion 215 is a neck-down portion formed on the electrically conductive pad 212. A width of the neck-down portion, i.e., the solder masking portion 215, is relatively smaller than that of the electrically conductive pad 212 corresponding to the electrically conductive pillar 221. In other words, the width of the electrically conductive pad 212 is relatively larger than that of the neck-down portion.

Since the electrically conductive pad 212 corresponding to the electrically conductive pillar 221 is wider than the neck-down portion, a solder that is reflown during the fabrication process remains on the wider electrically conductive pad 212 and does not flow into the narrower solder masking portion 215.

Figure 4:
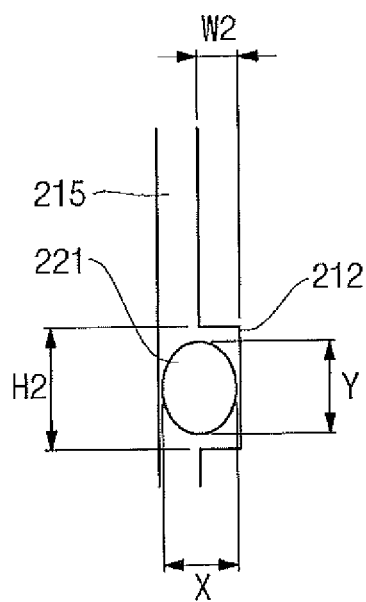
FIG. 4 is an enlarged view illustrating the relationship between dimensions of the electrically conductive pillar on the semiconductor die and the electrically conductive pad on the substrate in the semiconductor device shown in FIG. 3.

As illustrated in FIG. 4, the electrically conductive pillar 221 may have an elliptical cross-section with major and minor axis lengths. X and Y denote the minor and major axis lengths, respectively. H2 and W2 denote a length of the electrically conductive pad 212 and a depth of the solder masking portion 215 formed on either side of the electrically conductive pad 212, respectively. The depth W2 may also represent a decrement between the widths of the electrically conductive pad 212 and the solder masking portion 215.

The length H2 and the depth W2 may satisfy the following relationships:

$$Y*(5/4) \leq H2 \leq Y*(3/2)$$

$$X*(1/5) \leq W2 \leq X*(1/2)$$

where the length H2 of the electrically conductive pad 212 being coupled to the electrically conductive pillar 221 has a value ranging from five-fourths, that is, Y*(5/4), to three-halves of the major axis length, that is, Y*(3/2). If the length H2 is less than five-fourths of the major axis length, that is, Y*(5/4), it is difficult to faun a desired amount of a plating solder on the electrically conductive pad 212. If the length H2 exceeds three-halves of the major axis length, that is, Y*(3/2), the plating solder will be distributed over an overly wide area of the electrically conductive pad 112, so that it is difficult to arrange the electrically conductive pillars 221 at accurate positions.

Referring to FIGS. 5A through 5E, there are illustrated sequential steps of a method of fabricating a semiconductor device according to an embodiment of the present invention.

The method of fabricating a semiconductor device 100 according to an embodiment of the present invention includes providing a substrate, forming a plating solder, aligning a semiconductor die, and reflow and cooling. However, the present invention is not limited to the illustrated sequential steps of the fabricating method.

Figure 5A:
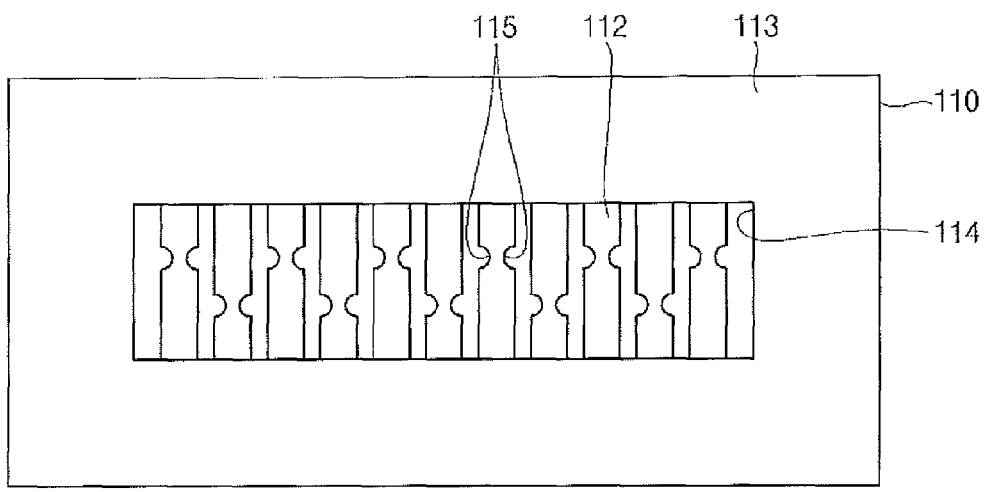
FIGS. 5A through 5E illustrate sequential steps of a method of fabricating a semiconductor device according to an embodiment of the present invention.

As illustrated in FIG. 5A, a substrate 110 is provided to include an insulating layer 111, a plurality of electrically conductive pads 112 formed on the insulating layer 111, and a passivation layer 113 covering edges of the electrically conductive pads 112.

The electrically conductive pads 112 are exposed to the outside through a window 114 in the passivation layer 113. Solder masking portions 115 are formed in the electrically conductive pads 112 so as to prevent a solder 130 melted during a reflow process from flowing into an unwanted region. The solder masking portions 115 may have any forms including, but not limited to, general grooves, neck-down portions, and equivalents thereof.

Figure 5B:
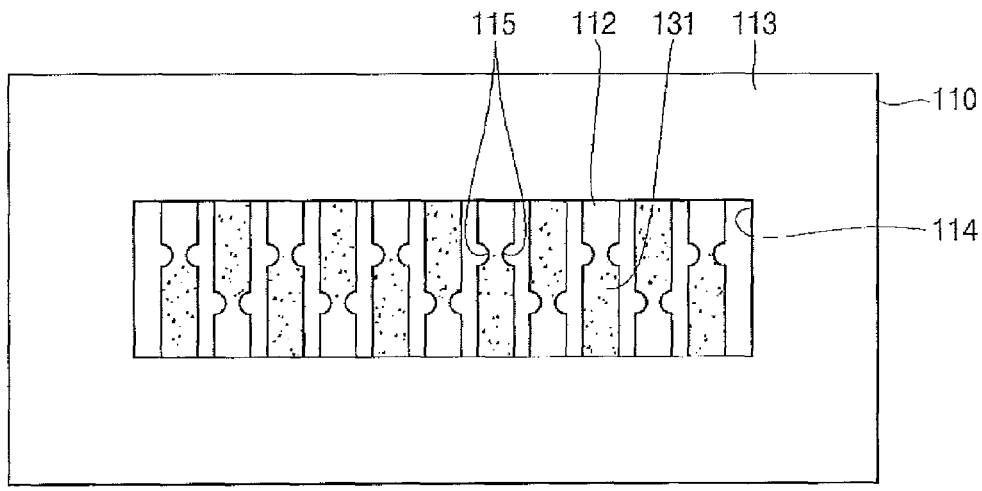
Figure 5C:
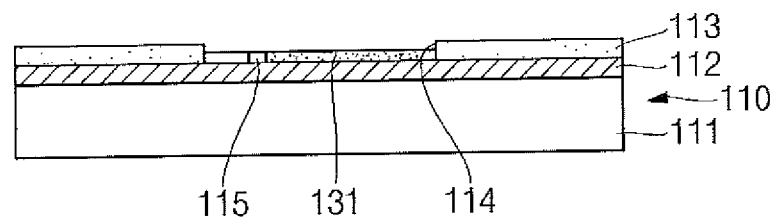

Referring to FIGS. 5B and 5C, a plating solder 131 is formed on only one side of each of the solder masking portions 115. That is, the plating solder 131 is not formed all over the semiconductor die 112 but formed only on a portion of the electrically conductive pad 112 to which an electrically conductive pillar 121 is coupled.

Figure 5D:
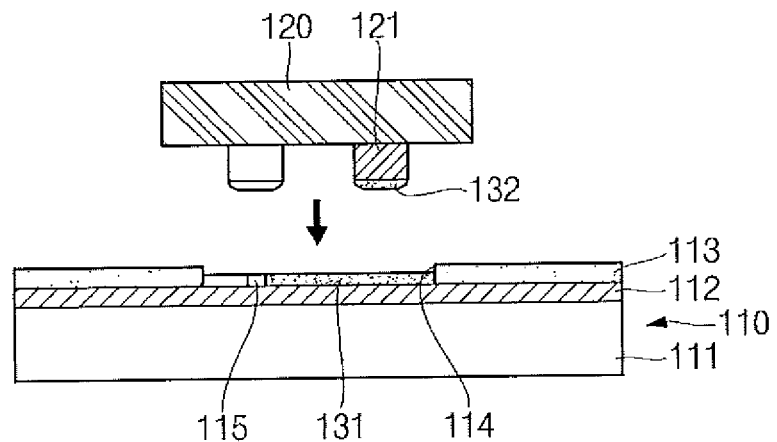

Referring to FIG. 5D, a semiconductor die 120 is aligned above the electrically conductive pads 112 on the substrate 110. Prior to the alignment, the semiconductor die 112 has a plurality of electrically conductive pillars 121 formed thereon, and each of the plurality of electrically conductive pillars 121 has a solder cap 132 at its lower end.

Figure 5E:
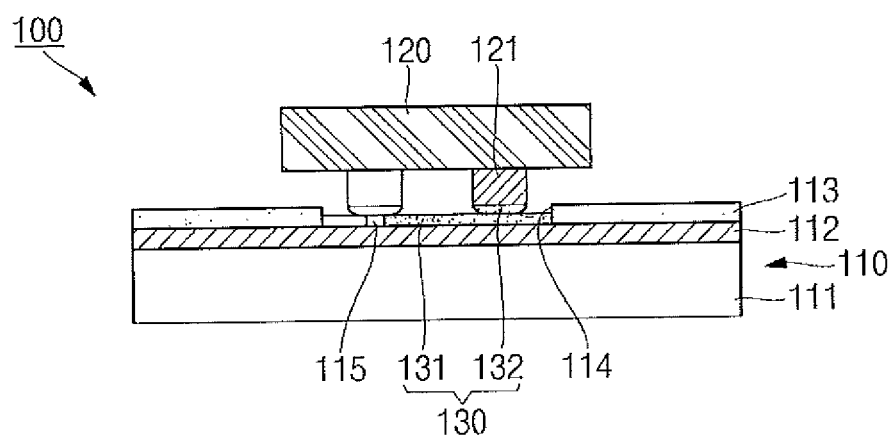

Referring to FIG. 5E, during the reflow and cooling, the substrate 110 and the semiconductor 120 aligned to each other are introduced into and taken out of a high temperature furnace (not shown) so as to electrically and mechanically couple the electrically conductive pillar 121 to the electrically conductive pad 112 through the solder 130.

Here, the high temperature furnace may be maintained at a temperature ranging from about 150° C. to about 250° C. Accordingly, the plating solder 131 on the electrically conductive pad 112 and the solder cap 132 at the electrically conductive pillar 121 are all reflown. Thus, the molten solder 130 tends to flow along the surface of the electrically conductive pad 112 in any random direction, but the solder masking portion 115 restricts the flow of the solder 130. That is, most of the molten solder 130 resides on the portion of the electrically conductive pad 112 corresponding to the electrically conductive pillar 121. When the substrate 110 and the semiconductor die 120 come out of the furnace, the solder 130 will rapidly cool down and harden. After the reflow and cooling, the electrically conductive pillar 121 on the semiconductor die 120 is electrically and mechanically connected to the electrically conductive pad 112 on the substrate 110 through the solder 130 consisting of the plating solder 131 and the solder cap 132.

Although not shown in FIGS. 5A through 5E, an underfill material may be subsequently injected into the gap between the substrate 110 and the semiconductor die 120, and an encapsulant may be applied to encapsulate the semiconductor die 120. If the process is performed in strips, the fabrication method may further include a singulation step wherein each strip is cut into individual semiconductor devices.

This disclosure provides exemplary embodiments of the present invention. The scope of the present invention is not limited by these exemplary embodiments. Numerous variations, whether explicitly provided for by the specification or implied by the specification, such as variations in structure, dimension, type of material and manufacturing process may be implemented by one of skill in the art in view of this disclosure.

What is claimed is:

1. A semiconductor device comprising:
   a plurality of conductive pads formed on a substrate;
   a plurality of conductive pillars formed on a semiconductor die;

a solder electrically coupling the plurality of conductive pillars to the plurality of conductive pads; and a solder masking portion formed in the plurality of conductive pads to prevent the solder from flowing in an unwanted direction on the plurality of conductive pads, wherein at least one conductive pillar of the plurality of conductive pillars has an elliptical cross-section with a minor axis length X and a major axis length Y, and a depth of the solder masking portion is defined as $X*(1/10) \leq W1 \leq X*(1/5)$.

2. The semiconductor device of claim 1, wherein the solder masking portion comprises a region of reduced width of the plurality of conductive pads.

3. The semiconductor device of claim 2, wherein the solder masking portion comprises grooves in the plurality of conductive pads.

4. The semiconductor device of claim 2, wherein the solder masking portion is formed symmetrically on both sides of the plurality of conductive pads.

5. The semiconductor device of claim 1, wherein the solder masking portion is formed in the plurality of conductive pads separated from one side of the plurality of conductive pillars and formed to reduce a width of the plurality of conductive pads.

6. The semiconductor device of claim 1, wherein the plurality of conductive pillars have elliptical cross-sections.

7. The semiconductor device of claim 6, wherein a major axis of the plurality of conductive pillars is parallel to that of the plurality of conductive pads.

8. The semiconductor device of claim 1, wherein the solder masking portion is separated from both sides of the plurality of conductive pillars and comprises a region of reduced width of the plurality of conductive pads.

9. The semiconductor device of claim 8, wherein the solder masking portion is a neck-down portion formed on the plurality of conductive pads.

10. The semiconductor device of claim 1, wherein the solder comprises:
a plating solder formed on the plurality of conductive pads; and
a solder cap formed on the plurality of conductive pillars.

11. The semiconductor device of claim 1, wherein the substrate further comprises a passivation layer having a window through which the plurality of conductive pads are exposed.

12. A semiconductor device comprising:
a plurality of conductive pads formed on a substrate;
a plurality of conductive pillars formed on a semiconductor die;
a solder electrically coupling the plurality of conductive pillars to the plurality of conductive pads; and
a solder masking portion formed in the plurality of conductive pads to prevent the solder from flowing in an unwanted direction on the plurality of conductive pads, wherein at least one conductive pillar of the plurality of conductive pillars has an elliptical cross-section with a minor axis length X and a major axis length Y, and a depth of the solder masking portion defined as $X*(1/10) \leq W1 \leq X*(1/5)$ a distance by which the solder masking portion is separated from the at least one conductive pillar of the plurality of conductive pillars is defined as $Y*(1/2) \leq H1 \leq Y$.

13. The semiconductor device of claim 12, wherein the solder masking portion comprises a region of reduced width of the plurality of conductive pads.

14. The semiconductor device of claim 12, wherein the solder masking portion is formed in the plurality of conductive pads separated from one side of the plurality of conductive pillars and formed to reduce a width of the plurality of conductive pads.

15. The semiconductor device of claim 14, wherein the solder masking portion comprises grooves in the plurality of conductive pads.

16. The semiconductor device of claim 14, wherein the solder masking portion is formed symmetrically on both sides of the plurality of conductive pads.

17. A semiconductor device comprising:
a plurality of conductive pads formed on a substrate;
a plurality of conductive pillars formed on a semiconductor die;
a solder electrically coupling the plurality of conductive pillars to the plurality of conductive pads; and
a solder masking portion formed in the plurality of conductive pads to prevent the solder from flowing in an unwanted direction on the plurality of conductive pads, wherein when at least one of the plurality of conductive pillars has an elliptical cross-section with a minor axis length X and a major axis length Y, then a depth of the solder masking portion is defined as $X*(1/5) \leq W2 \leq X*(1/2)$ and a distance by which the solder masking portion is separated from the plurality of conductive pillars is defined as $Y*(5/4) \leq H2 \leq Y*(3/2)$.

18. The semiconductor device of claim 17, wherein the solder masking portion comprises a region of reduced width of the plurality of conductive pads.

19. The semiconductor device of claim 17, wherein the solder masking portion is formed in the plurality of conductive pads separated from one side of the plurality of conductive pillars and formed to reduce a width of the plurality of conductive pads.

20. The semiconductor device of claim 19, wherein the solder masking portion comprises grooves in the plurality of conductive pads.

* * * * *